(12) United States Patent
Roberts et al.

(10) Patent No.: US 12,269,109 B2
(45) Date of Patent: Apr. 8, 2025

(54) WIRE BONDING CAPILLARY

(71) Applicant: CRAFTSTECH, INC., Elk Grove Village, IL (US)

(72) Inventors: Jeffrey C. Roberts, Elk Grove Village, IL (US); Jeffrey Taylor, Elk Grove Village, IL (US)

(73) Assignee: CRAFTSTECH, INC.

( * ) Notice: Subject to any disclaimer, the term of this patent is extended or adjusted under 35 U.S.C. 154(b) by 43 days.

(21) Appl. No.: 18/041,315

(22) PCT Filed: Aug. 19, 2021

(86) PCT No.: PCT/US2021/046635
§ 371 (c)(1),
(2) Date: Feb. 10, 2023

(87) PCT Pub. No.: WO2022/040394
PCT Pub. Date: Feb. 24, 2022

(65) Prior Publication Data
US 2023/0311239 A1    Oct. 5, 2023

Related U.S. Application Data

(60) Provisional application No. 63/068,231, filed on Aug. 20, 2020.

(51) Int. Cl.
*B23K 20/00* (2006.01)
*H01L 23/00* (2006.01)
*B23K 101/40* (2006.01)
*B23K 101/42* (2006.01)

(52) U.S. Cl.
CPC .......... *B23K 20/007* (2013.01); *H01L 24/78* (2013.01); *B23K 2101/40* (2018.08); *B23K 2101/42* (2018.08); *H01L 2224/78306* (2013.01); *H01L 2224/78309* (2013.01); *H01L 2924/40* (2013.01)

(58) Field of Classification Search
CPC ........ B23K 20/004; H01L 2224/78301; H01L 2224/78306; H01L 2224/78318
See application file for complete search history.

(56) References Cited

U.S. PATENT DOCUMENTS

| | | | | |
|---|---|---|---|---|
| 3,125,906 A | * | 3/1964 | Johnson | H01L 24/78 228/904 |
| 3,393,855 A | | 7/1968 | Moser | |
| 4,405,074 A | * | 9/1983 | Levintov | H01L 24/78 29/445 |
| 4,417,906 A | * | 11/1983 | Ohno | C04B 35/6264 264/654 |
| 5,127,923 A | * | 7/1992 | Bunting | C04B 35/563 51/293 |
| 5,151,247 A | * | 9/1992 | Haglund | C22C 1/051 419/60 |

(Continued)

FOREIGN PATENT DOCUMENTS

| JP | S5267261 A | 6/1977 |
|---|---|---|
| JP | S5748634 U | 3/1982 |

OTHER PUBLICATIONS

JPS5748634U computer English translation (Year: 2024).*

(Continued)

*Primary Examiner* — Erin B Saad

(57) ABSTRACT

A wire bonding capillary made of materials of differing hardness.

22 Claims, 3 Drawing Sheets

(56) References Cited

U.S. PATENT DOCUMENTS 5,853,873 A * 12/1998 Kukino .................. C04B 41/87
428/408
9,097,074 B2 * 8/2015 Shen .................. E21B 10/5676

OTHER PUBLICATIONS

Chapter 4: Material Property Charts ED, Ashby MF, Jan. 1, 2005 (Jan. 1, 2005) Materials Selection in Mechanical Design, Amsterdam (U.A.): Elsevier Butterworth-Heinemann, pp. 45-78.

* cited by examiner

WIRE BONDING CAPILLARY

This is a National Phase Application filed under 35 U.S.C. 371 as the national stage of PCT/US2021/046635 filed on Aug. 19, 2021, an application claiming the benefit of U.S. Application No. 63/068,231 filed on Aug. 20, 2020, the entire content of each of which is hereby incorporated by reference in its entirety.

FIELD OF THE DEVICE

The present disclosure relates to wire bonding capillaries used for fine wire bonding, and more particularly to a multi-part wire bonding capillary formed for different materials of varying hardness.

BACKGROUND

Several of today's electronic devices include circuit boards that have integrated circuits or semiconductors. Wire bonding is a method of making the interconnections between the integrated circuits and other contacts on the board. Capillaries are tools that are used in wire bonding machines to connect the contacts of the board.

A capillary includes an axial passageway therethrough that ends at a tip. A thin wire is feed through the axial passageway of the capillary to the tip. This wire is very thin and may have a thickness of about 1 mil. The end of the wire is formed into a small ball that is located at the tip of the capillary. The capillary pushes the ball down on to a contact of the circuit board and the ball is bonded to the contact using one or more of ultrasonic force, load, heat, etc. After the ball has been attached, the capillary is used to preform looping wherein the capillary carries and advances wire to a second contact. The capillary is then used to form a stich bond to bond the wire to the second contact, thereby making a connection between the two contacts.

The wire bonding process is carried out at very high speeds wherein the capillary is repeatedly contacting the circuit board several times a second. Because of this repeated contact and other forces placed on the capillary, the capillary tip typically becomes worn. Because the capillaries are working with materials that can be on the order of 1 mil, precision is highly desired. The slightest wearing of the capillary tip can significantly reduce the desired precision, and thus, wearing is highly undesirable.

Therefore, there remains a need for wear-resistant capillaries.

SUMMARY

In a first aspect, a wire bonding capillary includes a sleeve having a cavity. The capillary also includes a core located in the cavity of the sleeve. The core has a passageway therethrough for the passage of a wire. The sleeve is made of a first material and the core is at least partially made from a second material. The second material has a hardness that is greater than a hardness of the first material.

In another aspect, a method of making a wire bonding capillary includes placing a core within a cavity of a sleeve. The sleeve being made of a first material and the core being at least partially made from a second material, and wherein the second material has a hardness that is greater than a hardness of the first material.

In yet another aspect, a wire bonding capillary includes a shaft made of a first material and a tip made of a second material, wherein the second material is harder than the first material.

DESCRIPTION OF THE PREFERRED EMBODIMENT

Figure 1:
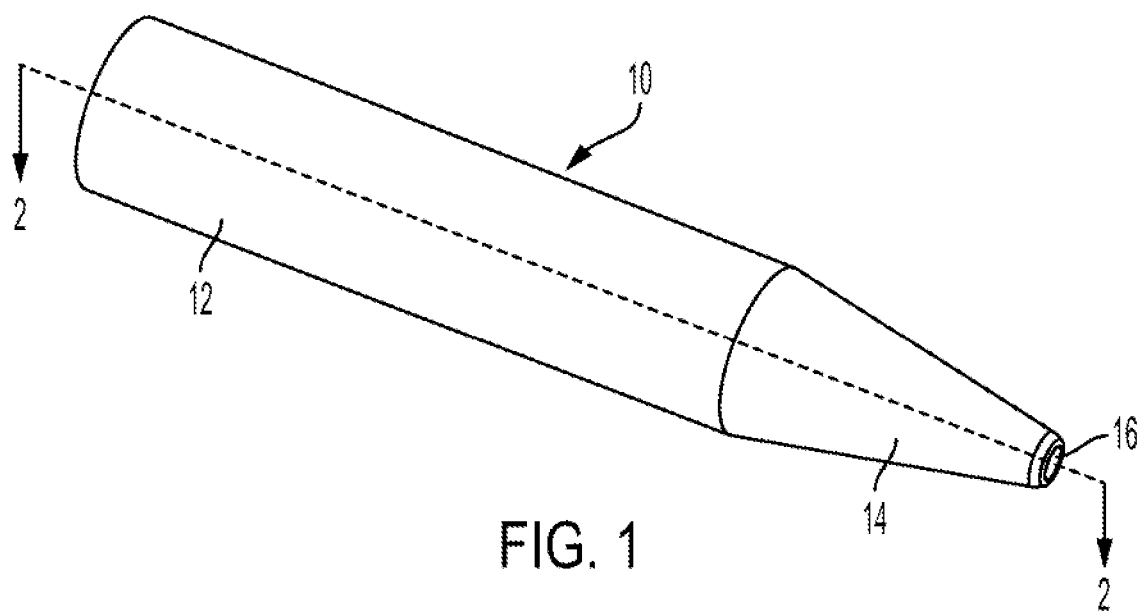
FIG. 1 is a perspective view of one embodiment of a capillary of the present disclosure.
Figure 2:
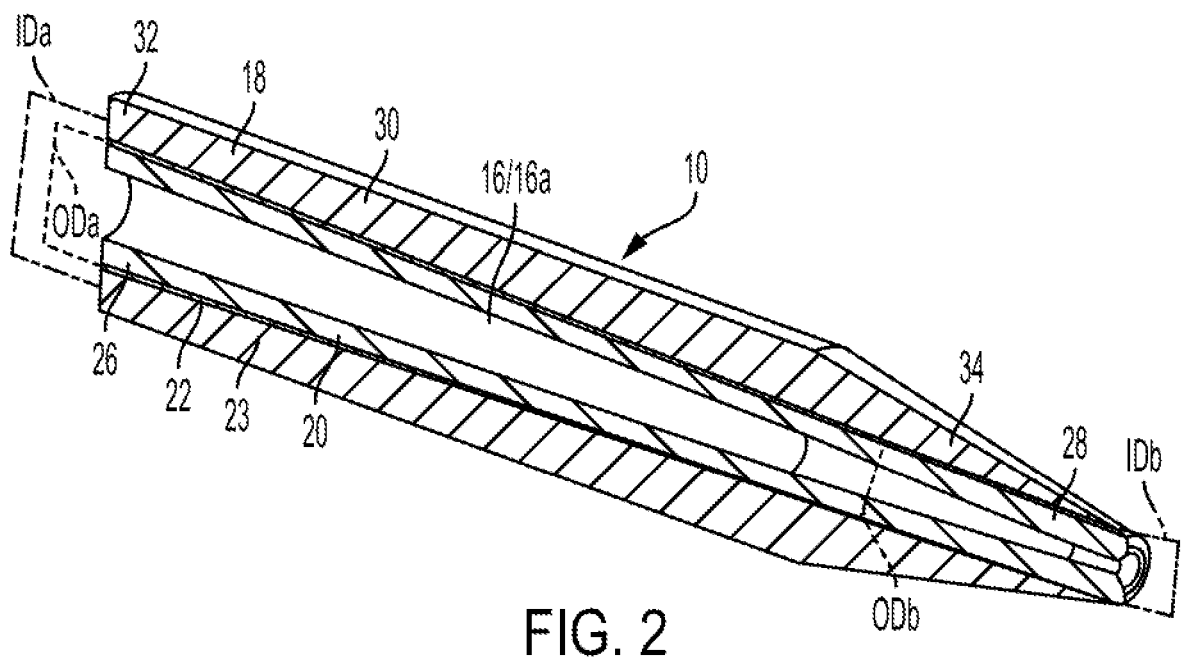
FIG. 2 is a cross-sectional view of the capillary of FIG. 1, taken along line 2-2 of FIG. 1.

Turning now to the figures, FIGS. 1 and 2 illustrate one embodiment of a wire bonding capillary 10 that may be in wire bonding to manufacture a circuit board. The capillary 10 has a wire receiving end 12 and a tip end 14. In use, wire is threaded through the passageway 16 of the capillary 10 and the capillary may be used to connect contacts on a circuit board by ball bonding, looping and/or stitch bonding.

Turning to FIG. 2, the capillary 10 includes a sleeve 18 and a core 20 located within a cavity 22 of the sleeve 18. As will be set forth in more detail below, the sleeve 18 may be made of a first material and the core 20 may be at least partially made of a second material that has a hardness that is greater than a hardness of the first material. The structure of the present disclosure allows the capillary, and in particular, the tip end 14 of the capillary to be made from an extremely hard material. The use of an extremely hard material is advantageous because such materials are resistant to wear. However, extremely hard materials are undesirably often very brittle and tend to fracture, chip and/or crack from repeated application of pressure thereto. For example, extremely hard, very brittle materials have not been used for capillaries and not considered for such use in the past because the brittleness of the material leads to fracture due to the constant and repeated impact that a capillary receives when bonding wire to a circuit board. Surprisingly, it has been found that extremely hard materials may be used in a capillary when the hard material is used as a core 20 and tip 14 and the core 20 is surrounded by a sleeve 18 of material that has a lesser hardness and is less brittle than the material of the core 20.

In one embodiment, the first material of the sleeve may be for example, Tungsten Carbide, Hardened Tool Steel, Aluminum, etc. The material of the sleeve may also have greater fracture toughness than the material of core 20, based on ASTM E1820-18be. The core 20 may be made from a material having a hardness greater than that of the sleeve 18. In one embodiment, the material of the core 20 may have a Vickers hardness that is greater than or equal to about 2,800 kg/mm$^2$. In other embodiments, the Vickers hardness of the material may be greater than or equal to about 3,000 kg/mm$^2$, or greater than or equal to about 4,000 kg/mm$^2$. In one embodiment, the material of the core 20 may include silicon carbide. In other embodiments, the material of the core 20 may include a diamond material. For example, the diamond material of the core 20 may be in an amount that is greater than 79% vol, or may be in an amount the is greater than 85% vol, or may be in an amount that is between 85% vol and 95% vol. The diamond material may be, for example, a ceramic diamond material, a polycrystalline diamond material or any other suitable diamond material. Furthermore, the material of the core 20 may be a composite including the diamond material and a binder. Such binders may include cobalt, silicon carbide and other suitable binder material. The binder may allow for the material to possess a relative conductivity so that it may be machined using electronic discharge machining processes. This processing and other processing may be employed to form the finished features of the core 20 and core tip that allow passage of a wire, formation of the wire end into a ball and/or severing of the wire. Furthermore, in addition to wear resistance, diamond material has a low coefficient of friction, which may assist in preventing the wire from sticking to the core 20.

Figure 3:
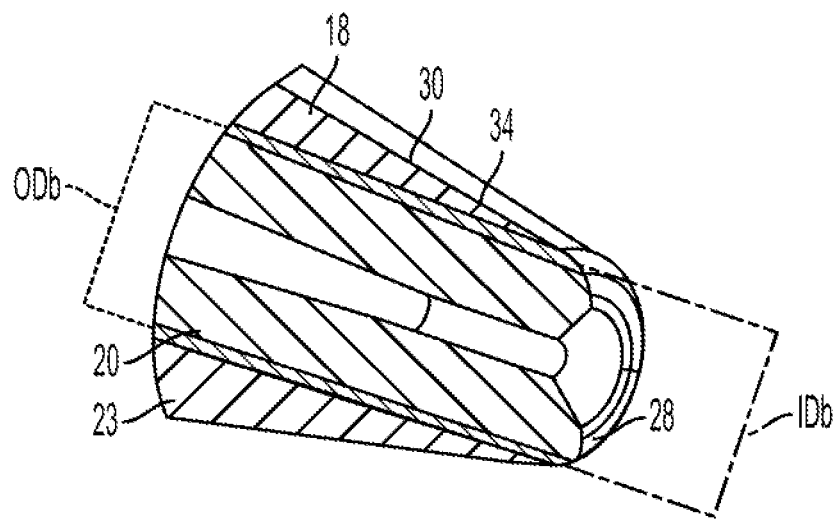
FIG. 3 is a cross-sectional view of the tip of the capillary of FIG. 1, taken along line 2-2 of FIG. 1.

Referring to FIGS. 2 and 3, the core 20 includes an elongated body 30 having a wire receiving end 26 and a tip end 28. The core 20 also includes a passageway 16a that defines the passageway 16 of the capillary 10. This passageway 16a is configured for the passage of bonding wire therethrough. The bonding wire may be on the order of 1 mil and the passageway 16a may have an inner diameter between about 0.02 mils and about 0.1 mil. Additionally, the inner diameter of the passageway 16a may taper toward the tip end 28 of the core 20.

The core 20 includes an outer diameter that may be between about 0.5 mil and about 2.5 mils. In one embodiment, the outer diameter has a first size ODa at the wire receiving end 26 of the elongated body 30 and a second size ODb at the tip end 28 of the elongated body 30. The first size ODa may be larger than the second size ODb. In one embodiment, the outer diameter of the elongated body 30 of core 20 may have a taper that tapers downward in a direction from the wire receiving end 26 toward the tip end 28. The taper may have a draft angle between about 0 degrees and about 5 degrees. The draft angle may be continuous, or it may vary along the length of the core. For example, the draft angle may start at 5 degrees and taper down to about 2 or 1 degrees along the length of the core 20. For example, in one embodiment the first size ODa of the outer diameter may be 0.89 mil and the second size ODb of the outer diameter may be 0.49 mil. Furthermore, the draft angle of the taper may be about 2 degrees.

The sleeve 18 includes an elongated body 30 having a wire receiving end 32 and tip end 34. The sleeve 18 includes the cavity 22 in which the core 20 is located. In one embodiment the elongated body 30 defines the cavity 22, which extends from the receiving end 32 to the tip end 34.

The wall 23 of the sleeve that defines cavity 22 includes an inner diameter that may be between about 0.5 mils and about 2.5 mils. In one embodiment, the inner diameter of wall 23 has a first size IDa at the wire receiving end 32 of the elongated body 30 and a second size IDb at the tip end 34 of the elongated body 30. The first size IDa may be larger than the second size IDb. In one embodiment, the inner diameter of the wall 23 defining the cavity 22 of the sleeve 18 may have a taper that tapers downward in a direction from the wire receiving end 32 toward the tip end 34. The taper may have a draft angle between about 0 degrees and about 5 degrees. The draft angle may be continuous, or it may vary along the length of the sleeve 18. For example, the draft angle may start at 5 degrees and taper down to about 2 or 1 degrees along the length of the sleeve 18. In one embodiment the first size IDa of the inner diameter may be 0.89 mil and the second size IDb of the inner diameter may be 0.49 mil. Furthermore, the draft angle of the taper may be about 2 degree.

The tolerance between the inner diameter of the wall 23 of sleeve 18 and the outer diameter of the core 20 may be such that an interference fit is created between the sleeve 18 and the core 20. For example, in one embodiment, prior to the core 20 being placed within the cavity 22 of the sleeve 18, the inner diameter of the wall 23 of sleeve 18 may be about 0.001 to about 0.003 mils smaller than the outer diameter of the core 20. Furthermore, when each of the inner diameter of the wall 23 and the outer diameter of the core 20 includes a draft angle, the draft angles may be complementary or commensurate at least along some corresponding sections of the wall 23 of the sleeve 18 and the core 20. As will be detailed further below, in one method of assembling the sleeve 18 and core 20 to form the capillary 10, the sleeve may be heated to expand the sleeve so that the core 20 may be inserted into the sleeve 18. When the sleeve cools, the sleeve may morph or bend into the core to form an interference fit. With this construct, the core 20 and the sleeve 18 act as a unitized, single entity. The toughness of the sleeve 18 surrounding the core 20 creates a system that allows for the extremely hard material of the core 20 (e.g., diamond-like material) to absorb the impact during use with a reduced risk of fracture and chipping of the core. Furthermore, the sleeve 18 allows the capture of the core 20 in a way for the capillary to be easily handled. For example, the assembly can be transitioned through manufacturing operations to end use with minimized risk to chipping.

Turning back to FIGS. 1, 2 and 3, when the core 20 is assembled with the sleeve 18, the tip end 28 of the core may extend beyond or out of the sleeve 18. As shown in this figure, the tip end 28 extends beyond tip end 34 of the sleeve 18. Thus, the tip end 28 is exposed so as to be the working part of the tool that contacts the circuit board during ball bonding and stitching. The tip end 28 may be machined or shaped as desired depending the desired use.

Figure 4:
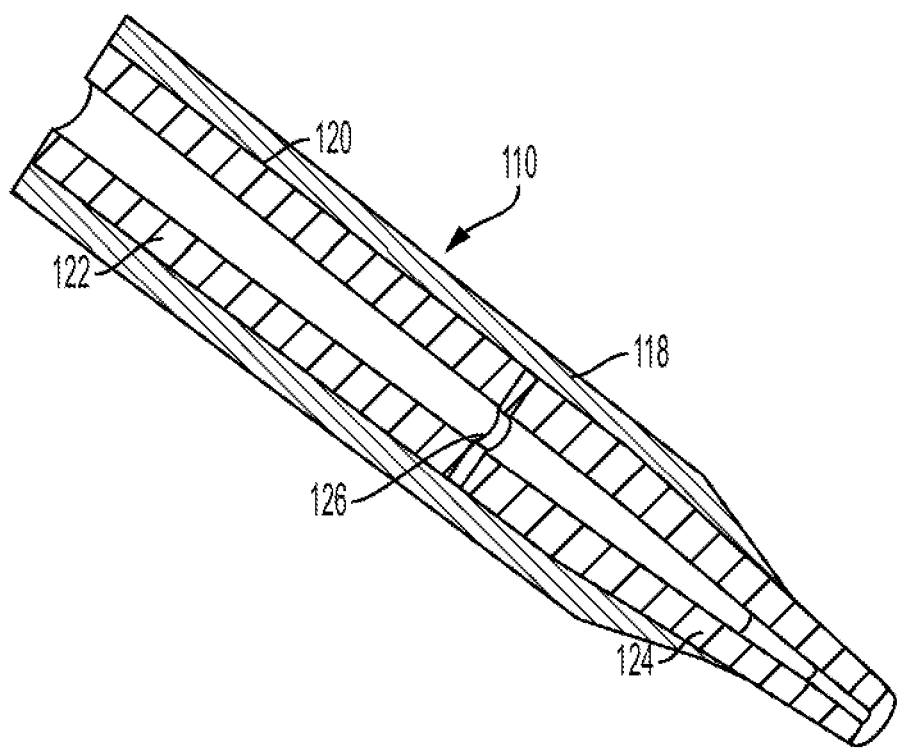
FIG. 4 is a cross-sectional view of another embodiment of a capillary of the present disclosure.

Referring to FIG. 4, there is shown another embodiment of a wire bonding capillary 110. The capillary 110 is substantially similar to the capillary 10 and can include any of the above structures, tolerances, tapers, sizes, etc. as described above. However, in this embodiment the core 120 includes a shaft 122 and a tip 124. The shaft 122 and the tip 124 may be made of different materials. Thus, the sleeve 118 may be made of the first material described above, the tip 124 may be made of the second material described above and the shaft 122 may be made of a third material. The first and the third materials may be the same material. Furthermore, the first and third material have a hardness that is less than the hardness of the second material. The first material of the sleeve 118 and third material of the shaft 122 may also have greater fracture toughness than the second material of the tip 124, based on ASTM E1820-18.

The tip 124 may be connected to the shaft 122 by bonding. Preferably, the bonding permanently affixes the shaft 122 and tip 124 to one another so as to form a unitized one-piece unit. The bonding may be, for example, brazing. In one embodiment, the brazing may be alloy brazing. The alloy brazing may contain elements of titanium, silver, nickel, aluminum, indium, tin, and/or copper. The shaft 122 and the tip 124 may be connected in other manners as well, such as by epoxy, shrink-fit, press-fit, mechanical. Referring to FIG. 4, the tip 124 may be connected to the shaft 122 by a brazed joint 126 between the tip 124 and shaft 122.

In one method of making a capillary in accordance with the present subject matter, a core as described above is placed within a cavity of a sleeve. As described above, the sleeve is made of a first material and the core is at least partially made from a second material, wherein the second material has a hardness that is greater than a hardness of the first material. In one alternative of placing the core into the sleeve, the sleeve is heated to a desire temperature and the core is inserted into the cavity of the sleeve from the wire receiving end of the sleeve. Heating of the sleeve may be beneficial when the core has a larger outer diameter than the inner diameter of the sleeve. Heating the sleeve will expand the inner diameter of the cavity, which will assist in inserting the core into the sleeve. After the core is inserted, the sleeve is cooled. As the sleeve is cooled it morphs or bends into the core to create an interference fit.

After the core is placed into the sleeve, the tip end of the core may be machined to a desired shape and size depending on the desired use. In one method of the making the capillary, when the core is placed in the sleeve, the sleeve may extend beyond the tip end of the core and/or cover the tip end of the core. During machining of the tip end of the core, the tip end of the sleeve may also be machined to remove a desired amount of the sleeve from the capillary such that the tip end of the core is exposed and/or extends beyond or out of the sleeve. The sleeve covering the tip end of the core prior to machining may assist in handling and machining the tip end of the core and help prevent fracturing or chipping during machining.

Figure 5:
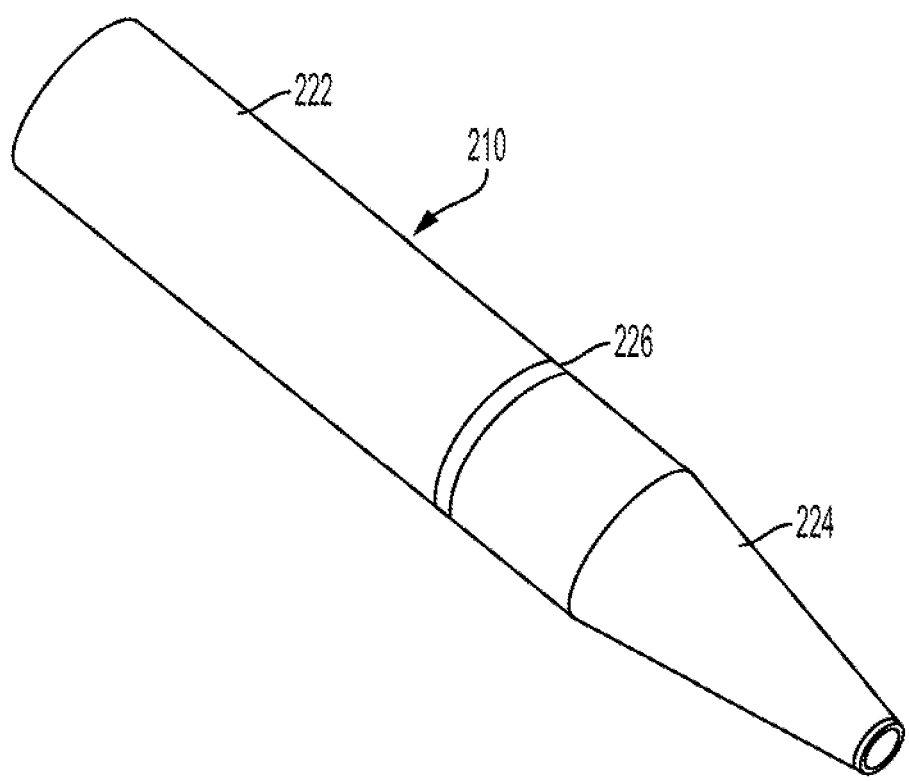
FIG. 5 is a perspective view of another embodiment of a capillary of the present disclosure.

FIG. 5 illustrates a capillary 210 similar to that of FIG. 4, except that the capillary does not include a sleeve. The capillary includes a shaft 222 that may be any of the materials of the shaft 122 described above and a tip 224 that may be any of the hard material of the tip 122/core 20 described above. Furthermore, the shaft 222 and the tip 224 may be bonded by any of the above described bonding methods, such as at a brazing joint 226.

Having thus described the device, various modifications and alterations will occur to those skilled in the art, which modifications and alterations will be within the scope of the device as defined by the appended claims.

The invention claimed is:

1. A wire bonding capillary, consisting of:
   a sleeve having a cavity; and
   a core consisting of a composite, the composite consisting of diamond greater than 79 vol. % and a binder consisting of silicon carbide placed in the cavity of the sleeve, the core having a passageway therethrough for passage of a wire,
   wherein the core has a hardness greater than a hardness of the sleeve.

2. The wire bonding capillary of claim 1, wherein the sleeve has an elongated body and the cavity extends from a wire receiving end of the elongated body to a tip end of the elongated body, and a wall of the sleeve defining the cavity has an inner diameter.

3. The wire bonding capillary of claim 2, wherein the inner diameter of the wall of the sleeve has a first size at the wire receiving end of the elongated body and a second size at the tip end of the elongated body, and the first size at the wire receiving end of the elongated body is greater than the second size at the tip end of the elongated body.

4. The wire bonding capillary of claim 2, wherein the inner diameter of the wall defining the cavity tapers downward in a direction from the wire receiving end of the elongated body toward the tip end of the elongated body.

5. The wire bonding capillary of claim 4, wherein a taper of the inner diameter of the wall defining the cavity has a draft angle from 0 to 5.

6. The wire bonding capillary of claim 5, wherein the core has an outer diameter and an elongated body having a wire receiving end and a tip end.

7. The wire bonding capillary of claim 6, wherein the outer diameter of the core tapers downward in a direction from the wire receiving end of the elongated body of the core toward the tip end of the elongated body of the core.

8. The wire bonding capillary of claim 6, wherein a taper of the outer diameter of the core corresponds to the taper of the inner diameter of the wall defining the cavity of the sleeve.

9. The wire bonding capillary of claim 6, wherein the inner diameter of the wall of the sleeve is smaller along at least a length of the wall than the outer diameter of the core along a corresponding length prior to the core being placed in the cavity of the sleeve.

10. The wire bonding capillary of claim 6, wherein the tip end of the core extends beyond the tip end of the sleeve.

11. The wire bonding capillary of claim 1, wherein the core has a hardness greater than or is equal to 2,800 kg/mm$^2$.

12. The wire bonding capillary of claim 1, wherein the core has a hardness greater than or is equal to 3000 kg/mm$^2$.

13. The wire bonding capillary of claim 1, wherein the core includes a shaft and a tip.

14. The wire bonding capillary of claim 1, wherein the sleeve comprises a metal.

15. The wire bonding capillary of claim 14, wherein the metal comprises tungsten carbide, aluminum or steel.

16. The wire bonding capillary of claim 1, wherein the sleeve has a fracture toughness greater than a fracture toughness of the core.

17. A method of making a wire bonding capillary, comprising:
    placing a core consisting of a composite, the composite consisting of diamond greater than 79 vol. % and a binder consisting of silicon carbide, in a cavity of a sleeve, the core having a passageway therethrough for passage of a wire,
    wherein the core has a hardness greater than a hardness of the sleeve.

18. The method of claim 17, wherein the placing the core in the cavity of the sleeve comprises heating the sleeve, and inserting the core into the cavity of the sleeve.

19. The method of claim 17, wherein an inner diameter of a wall defining the cavity of the sleeve, prior to placing the core in the cavity of the sleeve, is smaller than an outer diameter of the core.

20. The method of claim 17, further comprising machining a tip end of the core after placing the core in the cavity of the sleeve.

21. The method of any claim 20, wherein the machining the tip end of the core includes removing a section of the sleeve from the tip end of the core.

22. The method of claim 20, wherein the tip end of the core extends beyond a tip end of the sleeve.

* * * * *